United States Patent
Qu et al.

(10) Patent No.: US 10,278,309 B2
(45) Date of Patent: Apr. 30, 2019

(54) CABINET AND HEAT DISSIPATION SYSTEM

(71) Applicant: Huawei Technologies Co., Ltd., Shenzhen (CN)

(72) Inventors: Zhongjiang Qu, Shenzhen (CN); Shanjiu Chi, Shenzhen (CN); Yangfan Zhong, Shenzhen (CN); Jin Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/785,159

(22) Filed: Oct. 16, 2017

(65) Prior Publication Data

US 2018/0042141 A1 Feb. 8, 2018

Related U.S. Application Data

(63) Continuation of application No. PCT/CN2016/075405, filed on Mar. 3, 2016.

(30) Foreign Application Priority Data

Apr. 17, 2015 (CN) .......................... 2015 1 0185495

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/20163* (2013.01);
(Continued)

(58) Field of Classification Search
CPC ............. H05K 7/1489; H05K 7/20145; H05K 7/20172; H05K 7/20181; H05K 7/20336;
(Continued)

(56) References Cited

U.S. PATENT DOCUMENTS 4,699,208 A * 10/1987 Wolf ................... H05K 7/20918
165/122
5,823,248 A * 10/1998 Kadota ................. F25B 23/006
165/104.33
(Continued)

FOREIGN PATENT DOCUMENTS

CN 1860428 A 11/2006
CN 102378551 A 3/2012
(Continued)

*Primary Examiner* — Mandeep S Buttar
(74) *Attorney, Agent, or Firm* — Slater Matsil, LLP

(57) ABSTRACT

The present disclosure provides a cabinet and a heat dissipation system. The cabinet includes: an operating compartment, disposed on one side of a heat dissipation substrate, where the operating compartment is configured to accommodate a server; and a heat dissipation compartment, disposed on the other side of the heat dissipation substrate. Both the heat dissipation compartment and the operating compartment share the heat dissipation substrate as a compartment wall. The operating compartment is separated from the heat dissipation compartment by using the heat dissipation substrate. The heat dissipation compartment accommodates multiple heat dissipation fins, and the multiple heat dissipation fins are connected to the heat dissipation substrate. An air intake vent is disposed in a first compartment wall of the heat dissipation compartment, and an air exhaust vent is disposed in a second compartment wall of the heat dissipation compartment disclosure.

11 Claims, 7 Drawing Sheets

(52) U.S. Cl.
CPC ..... *H05K 7/20745* (2013.01); *H05K 7/20818* (2013.01); *H05K 7/20145* (2013.01); *H05K 7/20172* (2013.01); *H05K 7/20181* (2013.01); *H05K 7/20336* (2013.01); *H05K 7/20409* (2013.01)

(58) Field of Classification Search
CPC ........... H05K 7/20409; H05K 7/20736; H05K 7/20745; H05K 7/20818; H05K 7/20163
USPC ......... 361/679.47–679.52; 165/104.33, 80.3, 165/168, 86
See application file for complete search history.

(56) References Cited

U.S. PATENT DOCUMENTS

| | | | |
|---|---|---|---|
| 5,925,929 A * | 7/1999 | Kuwahara | H01L 23/427 165/80.4 |
| 6,336,691 B1 | 1/2002 | Maroney et al. | |
| 6,496,366 B1 * | 12/2002 | Coglitore | G06F 1/18 174/377 |
| 10,133,321 B1 * | 11/2018 | Bhopte | H05K 7/20163 |
| 2007/0081302 A1 | 4/2007 | Nicolai et al. | |
| 2009/0277614 A1 * | 11/2009 | Lin | F28D 15/0233 165/104.26 |
| 2011/0108250 A1 * | 5/2011 | Horng | G06F 1/28 165/121 |
| 2011/0146582 A1 * | 6/2011 | Lemmon | A01K 1/0047 119/448 |
| 2011/0304981 A1 * | 12/2011 | Huang | G06F 1/20 361/679.48 |
| 2014/0268549 A1 * | 9/2014 | Neumann | H05K 7/20772 361/679.47 |
| 2015/0021000 A1 * | 1/2015 | Ryoo | H05K 7/20663 165/104.26 |
| 2016/0021768 A1 * | 1/2016 | Webster | H05K 7/206 165/80.2 |

FOREIGN PATENT DOCUMENTS

| | | |
|---|---|---|
| CN | 103047723 A | 4/2013 |
| CN | 103747663 A | 4/2014 |
| CN | 103930847 A | 7/2014 |
| CN | 104812217 A | 7/2015 |

* cited by examiner

CABINET AND HEAT DISSIPATION SYSTEM

CROSS-REFERENCE TO RELATED APPLICATIONS

This application is a continuation of International Application No. PCT/CN2016/07545, filed on Mar. 3, 2016, which claims priority to Chinese Patent Application No. 201510185495.4, filed on Apr. 17, 2015. The disclosures of the aforementioned applications are hereby incorporated by reference in their entireties.

TECHNICAL FIELD

The present disclosure relates to the field of electronic devices, and in particular, to a cabinet and a heat dissipation system.

BACKGROUND

Currently, heat of a general-purpose server and a customized server in a data center is generally dissipated by using an air conditioner. However, it is expensive to use the air conditioner to cool air, and power consumption of the data center is too high. Currently, a power usage effectiveness (PUE) value of a conventional data center is generally around 2.0. Power consumed by an air conditioner accounts for around 30% of power consumed by the data center. A proportion of the power consumed by the air conditioner in the power consumed by the data center is relatively large. Therefore, a measure needs to be taken to improve heat dissipation efficiency, so as to reduce power consumption of the air conditioner, decrease a PUE value of the data center, and improve power usage effectiveness of the data center.

SUMMARY

Embodiments of the present disclosure provide a cabinet and a heat dissipation system, so as to improve heat dissipation efficiency, reduce power consumption, and improve power usage effectiveness.

According to a first aspect, a cabinet is provided. The cabinet includes: an operating compartment, disposed on one side of a heat dissipation substrate, where the operating compartment is configured to accommodate a server; and a heat dissipation compartment, disposed on the other side of the heat dissipation substrate. Both the heat dissipation compartment and the operating compartment share the heat dissipation substrate as a compartment wall. The operating compartment is separated from the heat dissipation compartment by using the heat dissipation substrate. The heat dissipation compartment accommodates multiple heat dissipation fins, and the multiple heat dissipation fins are connected to the heat dissipation substrate. The heat dissipation substrate is configured to conduct heat generated by the server in the operating compartment to the multiple heat dissipation fins. An air intake vent is disposed in a first compartment wall of the heat dissipation compartment, and an air exhaust vent is disposed in a second compartment wall of the heat dissipation compartment, so that natural air enters the heat dissipation compartment through the air intake vent and passes through the multiple heat dissipation fins, and then heat of the multiple heat dissipation fins is expelled through the air exhaust vent. The first compartment wall and the second compartment wall are compartment walls in the heat dissipation compartment except the heat dissipation substrate.

With reference to the first aspect, in a first possible implementation manner, when the operating compartment accommodates the server, a thermally conductive wall exists on a side on which a chassis of the server is connected to the heat dissipation substrate, a thermally conductive apparatus is disposed in the server, one end of the thermally conductive apparatus is connected to the thermally conductive wall, and the other end of the thermally conductive apparatus is connected to a device of the server, so that heat generated by the device of the server is conducted to the heat dissipation substrate by using the thermally conductive apparatus and the thermally conductive wall.

With reference to the first aspect or the first possible implementation manner, in a second possible implementation manner, the cabinet further includes a thermally conductive medium, disposed on a surface that is of the heat dissipation substrate and that is on the operating compartment side.

With reference to the first or the second possible implementation manner, in a third possible implementation manner, the server further includes: a first guiding plate, disposed on a side of the thermally conductive wall, and located outside the chassis of the server; a first cam mechanism, disposed between the first guiding plate and the thermally conductive wall; a second guiding plate, disposed on a side that is of a second side wall and that is right opposite to the thermally conductive wall, and located outside the chassis of the server; a second cam mechanism, disposed between the second guiding plate and the second side wall; and a first ejector handle and a second ejector handle, respectively connected to the first cam mechanism and the second cam mechanism; where the first guiding plate, the first cam mechanism, and the first ejector handle are configured as follows: when the first ejector handle is set to a first state, the first cam mechanism ensures that an interval between the first guiding plate and the thermally conductive wall is a first distance; the first guiding plate, the first cam mechanism, and the first ejector handle are further configured as follows: when the first ejector handle is set to a second state, the first cam mechanism ensures that an interval between the first guiding plate and the thermally conductive wall is a second distance, where a difference between the first distance and the second distance is a preset value; the second guiding plate, the second cam mechanism, and the second ejector handle are configured as follows: when the second ejector handle is set to the first state, the second cam mechanism ensures that an interval between the second guiding plate and the second side wall is a third distance; and the second guiding plate, the second cam mechanism, and the second ejector handle are further configured as follows: when the second ejector handle is set to the second state, the second cam mechanism ensures that an interval between the second guiding plate and the second side wall is a fourth distance, where a difference between the third distance and the fourth distance is the preset value.

With reference to the second or the third possible implementation manner, in a fourth possible implementation manner, no thermally conductive medium is disposed in a first area on the surface that is of the heat dissipation substrate and that is on the operating compartment side, but a groove is disposed in the first area to accommodate the first guiding plate, and the first area is an area in which the first guiding plate is in contact with the heat dissipation substrate when the server is placed into the operating compartment.

With reference to any one of the first aspect, or the first to the fourth possible implementation manners, in a fifth possible implementation manner, a fan is disposed in the heat dissipation compartment.

With reference to any one of the first aspect, or the first to the fifth possible implementation manners, in a sixth possible implementation manner, the heat dissipation compartment further includes a heat pipe, where one end of the heat pipe is connected to the heat dissipation substrate, and the other end of the heat pipe is connected to the multiple heat dissipation fins; and the heat pipe is configured to conduct heat of the heat dissipation substrate to the multiple heat dissipation fins.

With reference to the first aspect or any of the foregoing possible implementation manners, in a seventh possible implementation manner, an air vent is disposed in a compartment wall in the operating compartment except the heat dissipation substrate, a fan is disposed in the operating compartment, and the fan in the operating compartment and the air vent of the operating compartment are configured to expel at least a part of heat in the operating compartment from the operating compartment through the air vent.

According to a second aspect, a heat dissipation system is provided, where the heat dissipation system is configured to dissipate heat of a server in a data center and includes: at least one of the cabinet according to any one of the first aspect or the first to the seventh possible implementation manners; an air supply channel, where the inside of the air supply channel is separated from the inside of the data center, an air intake vent of the air supply channel is disposed outside the data center, and at least one air exhaust vent of the air supply channel is separately connected to an air intake vent of a heat dissipation compartment of the at least one cabinet, so that natural air enters the heat dissipation compartment of the cabinet through the air supply channel; and an air exhaust channel, where the inside of the air exhaust channel is separated from the inside of the data center, at least one air intake vent of the air exhaust channel is separately connected to an air exhaust vent of the heat dissipation compartment of the at least one cabinet, and an air exhaust vent of the air exhaust channel is disposed outside the data center, so that after passing through a heat dissipation fin in the heat dissipation compartment, the natural air is expelled from the data center through the air exhaust channel.

With reference to the second aspect, in a first possible implementation manner of the second aspect, the heat dissipation system further includes: a filter apparatus, disposed between the air exhaust vent of the air supply channel and the air intake vent of the heat dissipation compartment, and configured to filter the natural air.

With reference to the second aspect or the first possible implementation manner of the second aspect, in a second possible implementation manner of the second aspect, the heat dissipation system further includes: a cooling apparatus, disposed between the air exhaust vent of the air supply channel and the air intake vent of the heat dissipation compartment, and configured to start when a temperature of the natural air is higher than a first preset value, so as to reduce the temperature of the natural air.

According to the foregoing technical solutions in the present disclosure, heat generated by a server in an operating compartment is conducted to a heat dissipation fin in a heat dissipation compartment by using a heat dissipation substrate, and heat of the heat dissipation fin is expelled by using natural air. Therefore, heat dissipation efficiency can be improved, power consumption can be reduced, and power usage effectiveness can be improved.

BRIEF DESCRIPTION OF THE DRAWINGS

To describe the technical solutions in the embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present disclosure with reference to the accompanying drawings in the embodiments of the present disclosure.

In the specification, claims, and accompanying drawings of the present disclosure, the terms "first", "second", "third", "fourth", and so on are intended to distinguish between different objects but do not indicate a particular order.

Figure 1:
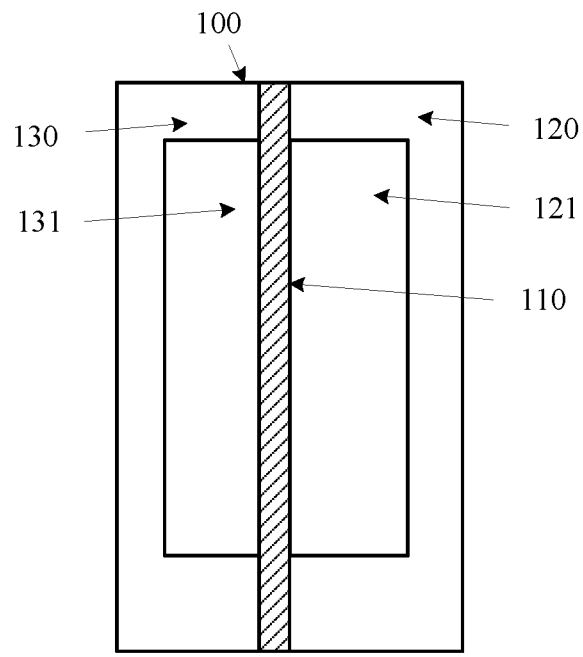
FIG. 1 is a schematic plan view of a cabinet according to an embodiment of the present disclosure.

FIG. 1 is a schematic plan view of a cabinet 100 according to an embodiment of the present disclosure. The cabinet 100 may be configured to dissipate heat of a server in a data center. As shown in FIG. 1, the cabinet 100 includes: an operating compartment 120, disposed on one side of a heat dissipation substrate 110, where the operating compartment 120 is configured to accommodate a server 121; and a heat dissipation compartment 130, disposed on the other side of the heat dissipation substrate 110. Both the heat dissipation compartment 130 and the operating compartment 120 share the heat dissipation substrate 110 as a compartment wall. The operating compartment 120 is separated from the heat dissipation compartment 130 by using the heat dissipation substrate 110. The heat dissipation compartment 130 accommodates multiple heat dissipation fins 131. The multiple heat dissipation fins 131 are connected to the heat dissipation substrate 110. The heat dissipation substrate 110 conducts heat generated by the server 121 in the operating compartment 120 to the multiple heat dissipation fins 131. An air intake vent is disposed in a first compartment wall of the heat dissipation compartment 130, and an air exhaust vent is disposed in a second compartment wall of the heat dissipation compartment 130, so that natural air enters the heat dissipation compartment 130 through the air intake vent and passes through the multiple heat dissipation fins 131, and then heat of the multiple heat dissipation fins 131 is expelled through the air exhaust vent.

The first compartment wall and the second compartment wall are compartment walls in the heat dissipation compartment 130 except the heat dissipation substrate 110. The first compartment wall and the second compartment wall may be compartment walls on a same side, or may be compartment walls on different sides. That is, the air intake vent and the air exhaust vent cannot be disposed on the heat dissipation substrate 110 between the operating compartment 120 and the heat dissipation compartment 130, and the heat dissipation compartment 130 is separated from the operating compartment 120 by using the heat dissipation substrate 110.

When the cabinet 100 is placed indoors (for example, inside the data center), the natural air refers to air outdoors (for example, outside the data center) in a natural environment.

According to the cabinet in this embodiment of the present disclosure, heat generated by a server in an operating compartment is conducted to a heat dissipation fin in a heat dissipation compartment by using a heat dissipation substrate, and heat of the heat dissipation fin is expelled by using natural air. Therefore, heat dissipation efficiency can be improved, power consumption can be reduced, and power usage effectiveness can be improved.

It should be noted that FIG. 1 merely shows a relative position relationship between the multiple heat dissipation fins 131 and the heat dissipation substrate 110. In an actual application scenario, a manner of arranging the multiple heat dissipation fins 131 on the heat dissipation substrate 110 may be set according to design of an air duct in the cabinet 100. For example, as shown in FIG. 1, an air duct formed by using adjacent heat dissipation fins 131 and the heat dissipation substrate 110 may be disposed along a direction perpendicular to a paper or along a vertical direction.

The heat dissipation compartment 130 is sealed and separated from the operating compartment 120 and the data center, the air intake vent of the heat dissipation compartment 130 is connected to an air supply channel, and the air exhaust vent of the heat dissipation compartment 130 is connected to an air exhaust channel. This ensures that no air flow in the heat dissipation compartment 130 can enter the operating compartment 120 and the data center in which the cabinet 100 is located. Even though air quality of the natural air is relatively poor, reliability of the server is not degraded.

The operating compartment and the heat dissipation compartment are independent of each other, and the server is usually maintained only in the operating compartment. Therefore, maintenance is more convenient. In addition, during the maintenance, the sealed heat dissipation compartment is not affected. Therefore, sealing design of the heat dissipation compartment can be implemented more easily.

Figure 2:
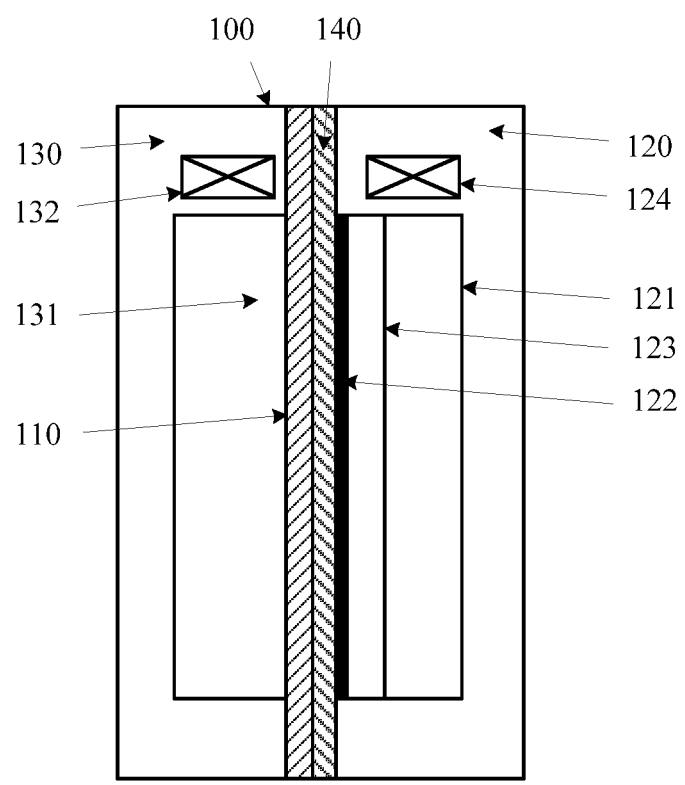
FIG. 2 is a schematic plan view of a cabinet according to another embodiment of the present disclosure.

Optionally, as shown in FIG. 2, when the operating compartment 120 accommodates the server 121, a thermally conductive wall 122 exists on a side on which a chassis of the server 121 is connected to the heat dissipation substrate 110. A thermally conductive apparatus 123 is disposed in the server 121. One end of the thermally conductive apparatus 123 is connected to the thermally conductive wall 122, and the other end of the thermally conductive apparatus 123 is connected to a device of the server 121, so that heat generated by the device of the server 121 is conducted to the heat dissipation substrate by using the thermally conductive apparatus 123 and the thermally conductive wall 122. The thermally conductive apparatus 123 may include a heat pipe with a heat-conducting property.

For example, the thermally conductive wall 122 may be 5 mm to 10 mm thick and be an aluminum plate or made of aluminum profiles.

It should be understood that a manner of disposing the thermally conductive apparatus 123 and the server 121 is not limited in this embodiment of the present disclosure. The thermally conductive apparatus 123 may be connected to a high-power device (such as a CPU or a memory) inside the server 121.

Optionally, as shown in FIG. 2, the cabinet 100 may further include: a thermally conductive medium 140, disposed on a surface that is of the heat dissipation substrate 110 and that is on the operating compartment 120 side.

the thermally conductive medium may be filled on the surface that is of the heat dissipation substrate 110 and that is on the operating compartment 120 side. For example, a single-sided sticky thermally conductive pad is stuck on the surface that is of the heat dissipation substrate 110 and that is on the operating compartment 120 side, so as to facilitate maintenance.

Optionally, the heat dissipation fins 131 are heat dissipation fins made of aluminum profiles or welding heat dissipation fins. It should be understood that the heat dissipation fins 131 may be heat dissipation fins made of another material. This is not limited in this embodiment of the present disclosure.

Optionally, as shown in FIG. 2, a fan 132 is disposed in the heat dissipation compartment 130. The fan in the heat dissipation compartment may accelerate air flowing in the heat dissipation compartment 130, thereby improving heat dissipation efficiency. A quantity and mounting positions of fans in the heat dissipation compartment 130 are not limited in this embodiment of the present disclosure. One or more fans may be disposed in the heat dissipation compartment 130, and the one or more fans may be mounted on any side of the heat dissipation fins 131, or mounted on both sides of the heat dissipation fins 131.

An air vent is disposed in a compartment wall in the operating compartment 120 except the heat dissipation substrate 110. A fan 124 is disposed in the operating compartment 120. The fan in the operating compartment 120 and the air vent of the operating compartment 120 are configured to expel at least a part of heat in the operating compartment 120 from the operating compartment 120 through the air vent.

In this embodiment of the present disclosure, most of heat in the operating compartment 120 is conducted into the heat dissipation compartment 130 by using the thermally conductive pad, and the remaining heat in the operating compartment 120 may be dissipated by using an air conditioner. For example, heat may be dissipated by supplying air by using a floor and returning air by using a ceiling of the data center in which the cabinet 100 is located.

Figure 3:
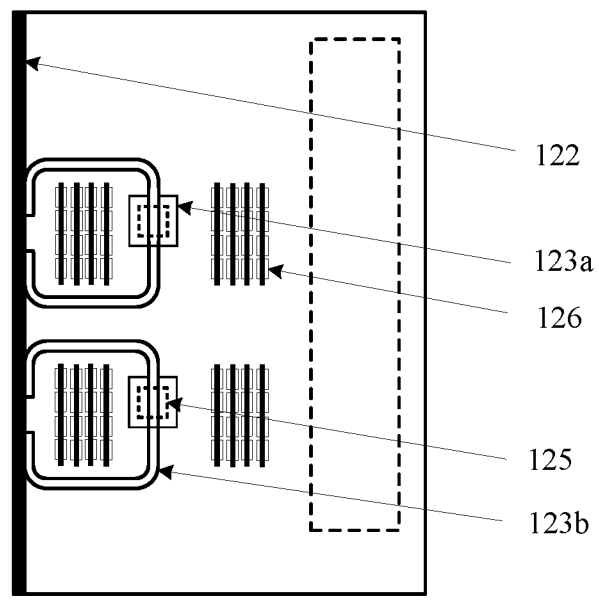
FIG. 3 is a schematic plan view of the inside of a server according to an embodiment of the present disclosure.
Figure 4:
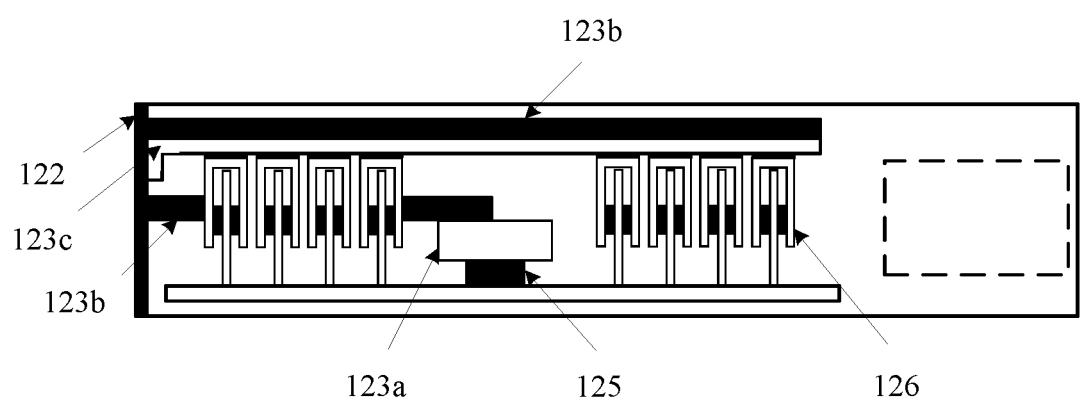
FIG. 4 is a schematic side view of the inside of a server according to an embodiment of the present disclosure.

The following describes in detail the thermally conductive apparatus 123 in the server 121 in this embodiment of the present disclosure with reference to FIG. 3 and FIG. 4.

FIG. 3 is a schematic plan view of the inside of a server according to an embodiment of the present disclosure. A thermally conductive apparatus 123 shown in FIG. 3 may include a thermally conductive substrate 123a of a CPU and a heat pipe 123b. The heat pipe 123b is connected to a thermally conductive wall 122, and the thermally conductive substrate 123a of the CPU is in contact with the heat pipe 123b and a CPU 125, so that heat of the CPU chip 125 is conducted to the thermally conductive wall 122 by using the thermally conductive substrate 123a and the heat pipe 123b. 126 shown in FIG. 3 may indicate a memory heat sink. As shown in FIG. 3, another unit or module in the server, such as a hard disk or a power supply, may be disposed in a dashed box on the right side of the server 121.

FIG. 4 is a schematic side view of the inside of a server according to an embodiment of the present disclosure. The thermally conductive apparatus 123 may further include a thermally conductive plate 123c disposed above the memory heat sink 126, and the heat pipe 123b may be disposed above the thermally conductive plate 123c, so that heat generated by a memory is conducted to the thermally conductive wall 122 by using the memory heat sink 126 and the heat pipe 123b. The thermally conductive plate 123c may be a thermally conductive aluminum plate, or may be a thermally conductive plate made of another material. A thermally conductive pad may be disposed between the memory heat sink 126 and the thermally conductive plate 123c, so as to further improve thermally conductive efficiency.

For ease of description, FIG. 3 and FIG. 4 merely show a possible implementation manner of the thermally conductive apparatus 123. A person skilled in the art should understand that another implementation manner of the thermally conductive apparatus inside the server shall fall within the protection scope of the embodiments of the present disclosure.

In this embodiment of the present disclosure, a heat pipe, a memory heat sink, and a thermally conductive plate are disposed inside a server to conduct heat generated by all components inside the server to a thermally conductive wall, instead of conducting the heat by disposing a liquid loop. Therefore, a reliability risk to the server that is caused by liquid leakage can be avoided.

Figure 5:
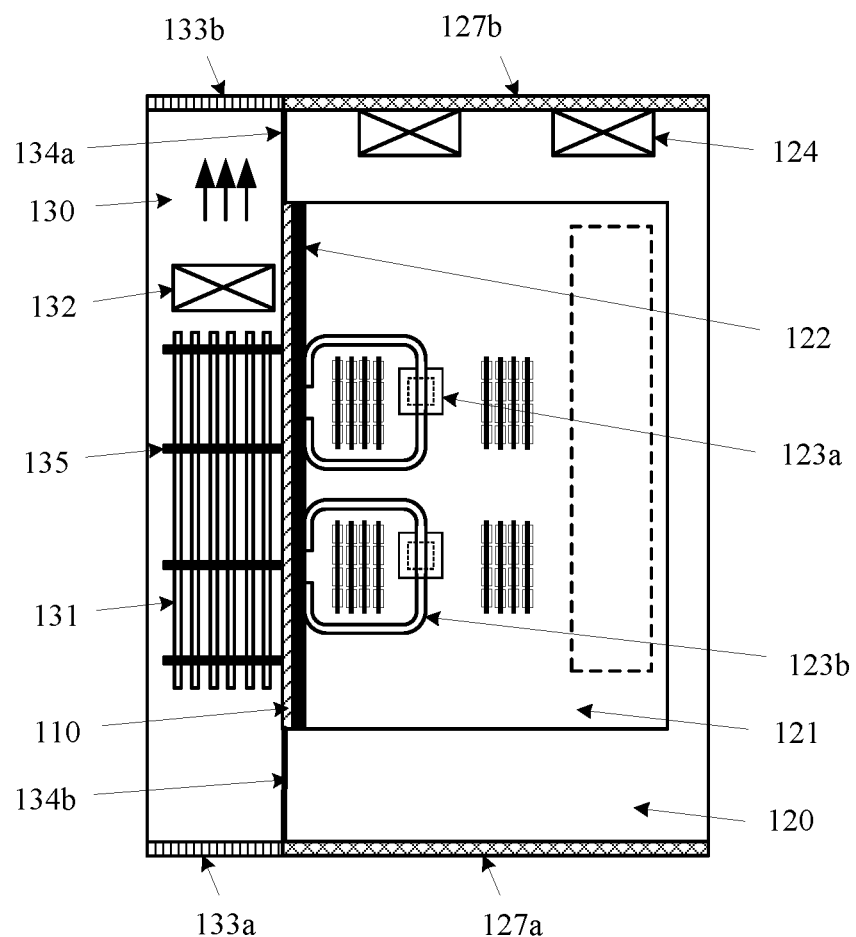
FIG. 5 is a schematic top view of a cabinet according to another embodiment of the present disclosure.

FIG. 5 is a schematic top view of a cabinet according to another embodiment of the present disclosure. The cabinet shown in FIG. 5 is an example of the cabinet shown in FIG. 1 and FIG. 2.

As shown in FIG. 5, 133a and 133b may respectively indicate a front door and a rear door of a heat dissipation compartment 130. The front door 133a and the rear door 133b of the heat dissipation compartment 130 are sealed and separated, so as to prevent an air flow in the heat dissipation compartment 130 from blowing outside the heat dissipation compartment. A fan 132 is mounted on a side of a heat dissipation fin 131. The fan 132 absorbs natural air of an external environment into the heat dissipation compartment 130 by using an air supply channel of a data center in which the cabinet 100 is located. After passing through the heat dissipation fin 131, the natural air is expelled outside the data center by using an air exhaust channel of the data center. A length of a heat dissipation substrate 110 shown in FIG. 5 is the same as a length of a server 121. In this case, a sealing spacer 134a and a sealing spacer 134b may be disposed inside the heat dissipation compartment 130, so as to prevent the air flow in the heat dissipation compartment 130 from blowing into an operating compartment 120. It should be understood that the heat dissipation substrate 110 may be extended on both ends in a vertical direction shown in FIG. 5 to positions of the sealing spacers 134a and 134b shown in FIG. 5. 127a and 127b respectively indicate a front door and a rear door of the operating compartment 120. An air vent is disposed in the front door 127a, and a fan is disposed on the rear door 127b side. Most of heat in the operating compartment 120 is conducted to the heat dissipation fin 131 in the heat dissipation compartment 130 by using the heat dissipation substrate, and the remaining heat is expelled into an equipment room by using the fan 124 and the air vent in the front door 127a, and then the heat is dissipated by using an air conditioner.

FIG. 5 shows that the natural air enters through the front door 133a of the heat dissipation compartment 130 and is expelled through the rear door 133b. It should be understood that the natural air may enter through the rear door 133b of the heat dissipation compartment 130 and be expelled through the front door 133a.

It should be noted that the example in FIG. 5 is intended to help a person skilled in the art better understand the embodiments of the present disclosure, but not to limit the scope of the embodiments of the present disclosure. Apparently, a person skilled in the art may make various equivalent modifications or variations according to the example provided in FIG. 5, and such modifications or variations shall also fall within the scope of the embodiments of the present disclosure.

A manner of connecting the heat dissipation fin to the heat dissipation substrate is not limited in this embodiment of the present disclosure. For example, the heat dissipation fin may be connected to the heat dissipation substrate in a welding manner, or the heat dissipation fin may be connected to the heat dissipation substrate by using a specific component.

For example, as shown in FIG. 5, the heat dissipation compartment 130 may further include a heat pipe 135. One end of the heat pipe 135 is connected to the heat dissipation substrate 110, and the other end of the heat pipe 135 is connected to multiple heat dissipation fins 131. The heat pipe 135 is configured to conduct heat of the heat dissipation substrate 110 to the multiple heat dissipation fins 131.

For example, one end of the heat pipe 135 may be welded to the heat dissipation substrate 110, or may be connected to the heat dissipation substrate 110 by using another connection element. Holes may be punched on the multiple heat dissipation fins 131, and the other end of the heat pipe 135 may pass through the holes on the multiple heat dissipation fins 131 to connect the multiple heat dissipation fins 131. Alternatively, the heat pipe 135 may be connected to the multiple heat dissipation fins 131 in another manner. This is not limited in this embodiment of the present disclosure.

It should be understood that FIG. 1 to FIG. 5 merely show a scenario in which the operating compartment 120 is located on the right side of the heat dissipation compartment 130. Alternatively, the operating compartment 120 may be located on the left side of the heat dissipation compartment 130. This is not limited in this embodiment of the present disclosure.

Figure 6:
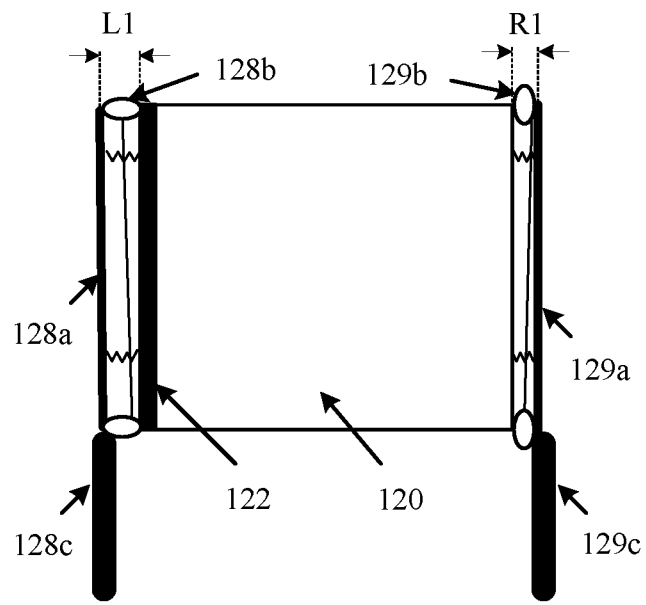
FIG. 6 is a schematic top view of a server according to an embodiment of the present disclosure.
Figure 7:
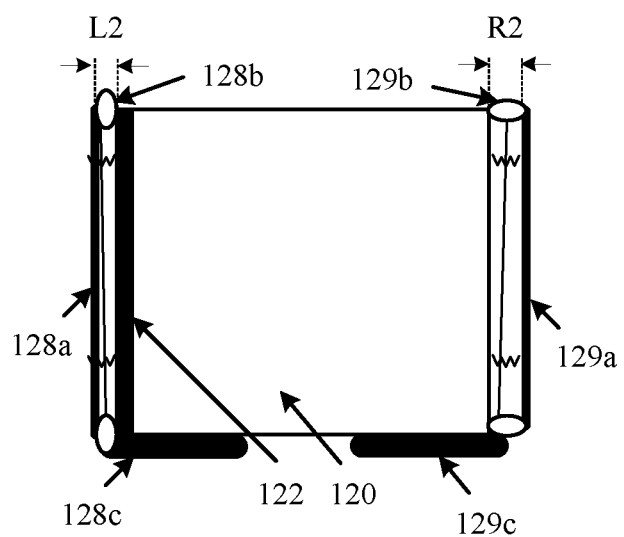
FIG. 7 is another schematic top view of a server according to an embodiment of the present disclosure.

FIG. 6 and FIG. 7 are schematic top views of a server 121. Optionally, as shown in FIG. 6 and FIG. 7, the server 121 may further include: a first guiding plate 128a, disposed on a side of a thermally conductive wall 122, and located outside a chassis of the server 121; a first cam mechanism 128b, disposed between the first guiding plate 128a and the thermally conductive wall 122; a second guiding plate 129a, disposed on a side that is of a second side wall and that is right opposite to the thermally conductive wall 122, and located outside the chassis of the server 121; a second cam mechanism 129b, disposed between the second guiding plate 129a and the second side wall; and a first ejector handle 128c and a second ejector handle 129c that are respectively connected to the first cam mechanism 128b and the second cam mechanism 129b.

The first guiding plate 128a, the first cam mechanism 128b, and the first ejector handle 128c are configured as follows: when the first ejector handle 128c is set to a first state, the first cam mechanism 128b ensures that an interval between the first guiding plate 128a and the thermally conductive wall 122 is a first distance L1.

The first guiding plate 128a, the first cam mechanism 128b, and the first ejector handle 128c are further configured as follows: when the first ejector handle 128c is set to a second state, the first cam mechanism 128b ensures that an interval between the first guiding plate 128a and the thermally conductive wall 122 is a second distance L2, where a difference between the first distance L1 and the second distance L2 is a preset value.

The second guiding plate 129a, the second cam mechanism 129b, and the second ejector handle 129c are configured as follows: when the second ejector handle 129 is set to the first state, the second cam mechanism 129b ensures that an interval between the second guiding plate 129a and the second side wall is a third distance R1.

The second guiding plate 129a, the second cam mechanism 129b, and the second ejector handle 129c are further configured as follows: when the second ejector handle 129 is set to the second state, the second cam mechanism 129b ensures that an interval between the second guiding plate 129a and the second side wall is a fourth distance R2, where a difference between the third distance R1 and the fourth distance R2 is the preset value.

For example, the first state may be an open state, and the second state may be a close state. L1−L2=X, and R2−R1=X.

Figure 8:
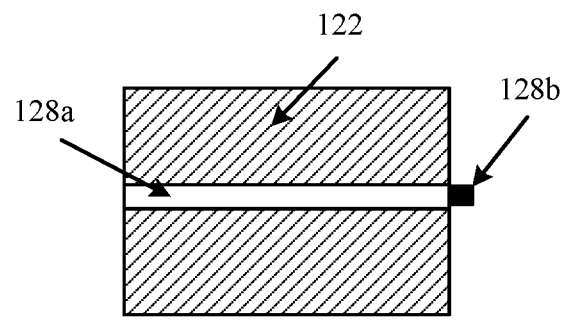
FIG. 8 is a schematic diagram of a server on a thermally conductive wall side according to an embodiment of the present disclosure.

FIG. 6 is a schematic top view of a server 121 when two ejector handles 128c and 129c are in an open state. FIG. 7 is a schematic top view of a server 121 when two ejector handles 128c and 129c are in a close state. Heights of the first guiding plate 128a and the second guiding plate 129a are less than a height of a side wall of the server 121. As shown in FIG. 8, FIG. 8 is a view of a server 121 on a thermally conductive wall 122 side. In addition, a connecting rod is disposed between the cam mechanism and the ejector handle, and a spring is disposed between the guiding plate and a side wall of the chassis.

Figure 9:
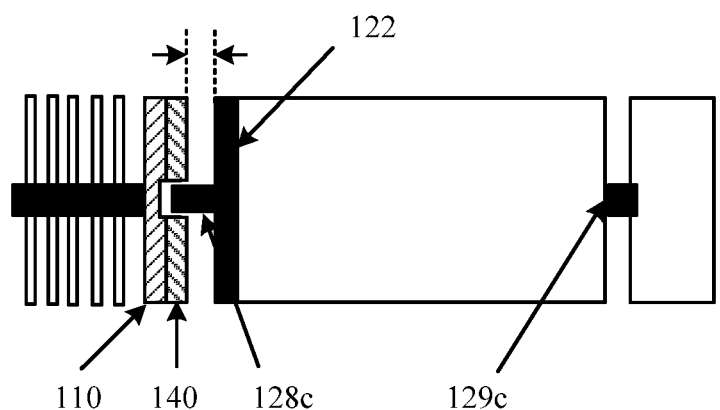
FIG. 9 is a schematic diagram of two ejector handles in an open state after a server is inserted into a cabinet according to an embodiment of the present disclosure.

FIG. 9 is a schematic front view of two ejector handles 128c and 129c in an open state after a server 121 is inserted into an operating compartment 120. The two ejector handles 128c and 129c are opened, and the server 121 is inserted into the operating compartment 120. The server 121 is inserted into the operating compartment 120 under the guiding action of the left guiding plate 128a and the right guiding plate 129a. Design of the left guiding plate 128a ensures that an interval between the thermally conductive wall 122 and a thermally conductive pad 140 on the heat dissipation substrate 110 is a preset distance X (for example, X=3 mm), so as to avoid damage to the thermally conductive pad 140 when the server 121 is inserted into the operating compartment 120.

Correspondingly, no thermally conductive medium 140 is disposed in a first area on a surface that is of the heat dissipation substrate 110 and that is on the operating compartment 120 side, but a groove is disposed in the first area to accommodate the first guiding plate 128a. The first area is an area in which the first guiding plate 128a is in contact with the heat dissipation substrate 110 when the server 121 is placed into the operating compartment 120.

Figure 10:
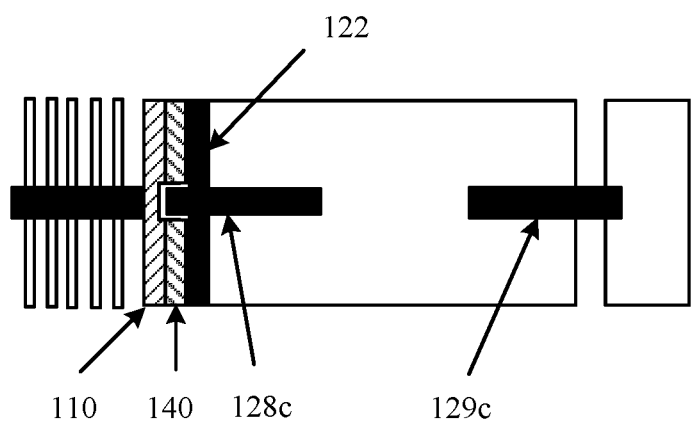
FIG. 10 is a schematic diagram of two ejector handles in a close state after a server is inserted into a cabinet according to an embodiment of the present disclosure.

That is, as shown in FIG. 9, no thermally conductive pad is disposed at a place that is on the heat dissipation substrate 110 and that is corresponding to the guiding plate 128a, but a groove is cut at the place at which the guiding plate 128a is in contact with the heat dissipation substrate 110. After the server 121 is properly inserted, the left ejector handle 128c is first closed, so that the guiding plate 128a shrinks to the right by a preset distance X under the force action of the spring; then the right ejector handle 129 is closed, so that the entire server 121 moves to the left by the preset distance X or by a distance slightly greater than X, for example, greater than 3 mm, under the action of the right ejector handle 129c and the cam mechanism 129b. In this way, the thermally conductive pad 140 is compressed tightly against the thermally conductive wall 122, so that the thermally conductive pad 140 is in good contact with the thermally conductive wall 122 of the server 121. FIG. 10 is a schematic plan view of two ejector handles 128c and 129c that are closed after a server 121 is inserted into an operating compartment 120. It should be noted that, correspondingly, during maintenance, the right ejector handle 129C should be opened first, so that the right guiding plate 129a shrinks to the left by the preset distance; then the left ejector handle 128c should be opened, so that the entire server 121 moves to the right by the preset distance under the action of the ejector handle 128c and the cam mechanism 128b and that the interval between the thermally conductive wall 122 and the thermally conductive pad 140 is the preset distance; and then the server 121 should be removed from the operating compartment 120. In this way, damage to the thermally conductive pad 140 is avoided when the server 121 is removed.

According to the server in this embodiment of the present disclosure, ejector handles are opened and closed in order, so that a heat dissipation substrate can be separated from or compressed tightly against a thermally conductive wall of the server while ensuring no damage to a thermally conductive pad.

According to the cabinet in this embodiment of the present disclosure, heat generated by a server in an operating compartment is conducted to a heat dissipation fin in a heat dissipation compartment by using a heat dissipation substrate, and heat of the heat dissipation fin is expelled by using natural air. Therefore, heat dissipation efficiency can be improved, power consumption can be reduced, and power usage effectiveness can be improved.

The present disclosure further provides a heat dissipation system 1100. The heat dissipation system 1100 includes: at least one cabinet 100, where the cabinet 100 includes an operating compartment 120 and a heat dissipation compartment 130; an air supply channel 150; and an air exhaust channel 151.

Figure 11:
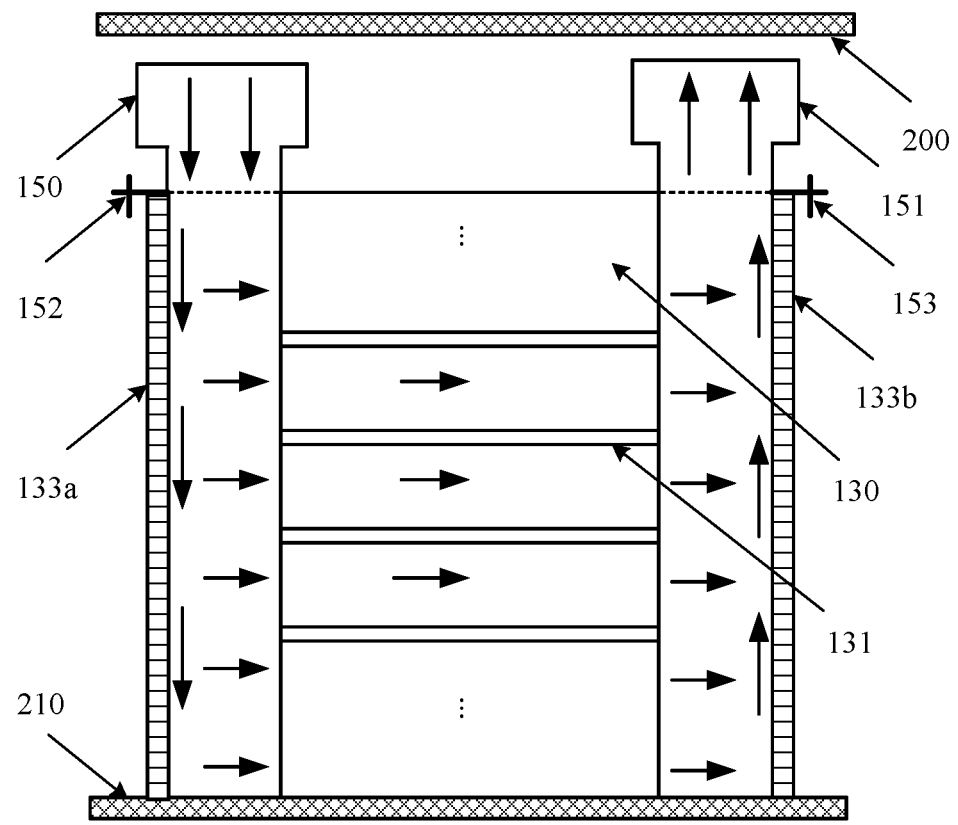
FIG. 11 is a schematic plan view of a heat dissipation system according to an embodiment of the present disclosure.

As shown in FIG. 11, the inside of the air supply channel 150 is separated from the inside of a data center; an air intake vent of the air supply channel 150 is disposed outside the data center; and at least one air exhaust vent of the air supply channel 150 is connected to an air intake vent of a heat dissipation compartment of the at least one cabinet 100, so that natural air enters the heat dissipation compartment of the cabinet 100 through the air supply channel 150. The inside of the air exhaust channel 151 is separated from the inside of the data center; at least one air intake vent of the air exhaust channel 151 is connected to an air exhaust vent of the heat dissipation compartment of the at least one cabinet 100; and an air exhaust vent of the air exhaust channel 151 is disposed outside the data center, so that after passing through a heat dissipation fin inside the heat dissipation compartment, the natural air is expelled from the data center through the air exhaust channel 151.

The inside of the air supply channel 150 and the inside of the air exhaust channel 151 are separated from the inside of the data center. This ensures that no natural air can enter the data center, and impact that is caused by the external natural air on reliability of the data center can be avoided.

In this embodiment of the present disclosure, natural air is supplied to a heat dissipation compartment of a cabinet inside a data center through an air supply channel, and after passing through the heat dissipation compartment to dissipate heat of a heat dissipation fin, the natural air is expelled from the data center through an air exhaust channel.

Therefore, according to the heat dissipation system in this embodiment of the present disclosure, natural air is supplied through an air supply channel for heat dissipation, power consumption of an air conditioner in a data center can be reduced, and power usage effectiveness of the data center can be improved.

Figure 12:
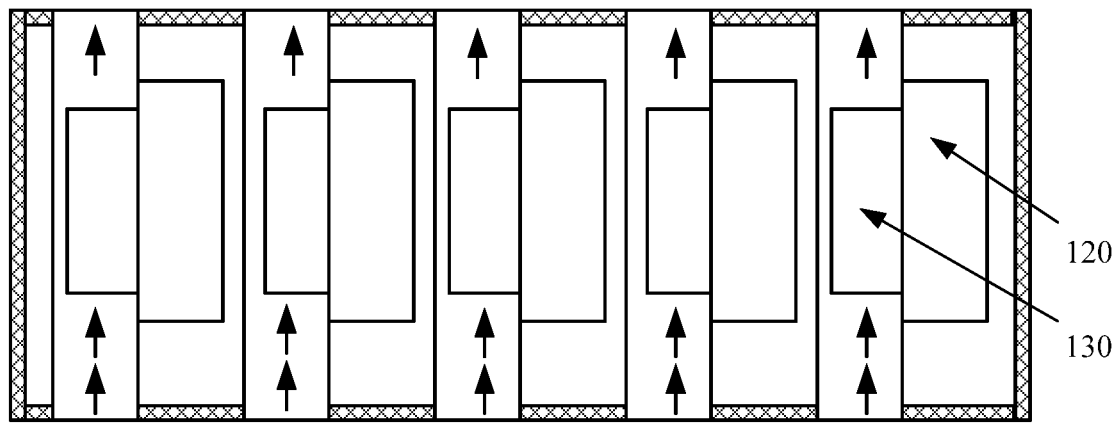
FIG. 12 is a schematic planning and design diagram of a data center in which a heat dissipation system is located according to an embodiment of the present disclosure.

FIG. 12 is a schematic planning and design diagram of a data center in which a heat dissipation system 1100 is located according to an embodiment of the present disclosure. FIG. 12 is a top view of the data center. As shown in FIG. 12, the data center may accommodate multiple cabinets 100, and the multiple cabinets 100 may be arranged side by side. Heat dissipation compartment 130 of each cabinet 100 may be disposed on the right side of an operating compartment 120. The air supply channel 150 and the air exhaust channel 151 may supply air and expel air for a cabinet in each row.

The air supply channel 150 and the air exhaust channel 151 may be disposed between a top of the cabinet and a ceiling. As shown in FIG. 11, 200 indicates the ceiling, and 210 indicates a floor.

Natural cool air is supplied to the inside of the data center through the air supply channel 150 and is distributed between the cabinets 100. The natural cool air enters the heat dissipation compartment 130 through an air intake vent and passes through heat dissipation fins in the heat dissipation compartment 130 of the cabinet 100. Then, hot air comes out through an air exhaust vent of the heat dissipation compartment 130 and is expelled from the data center through the air exhaust channel 151. At least a part of heat in the operating compartment 120 may be dissipated by using an air conditioner. Cool air is supplied through the floor and passes through the operating compartment 120. Then, hot air enters the air conditioner through the ceiling, and a cycle is completed.

It should be understood that the heat dissipation compartment 130 of a cabinet may be disposed on the right side of the operating compartment 120. It should be further understood that a ratio of a size of the heat dissipation compartment 130 to a size of the operating compartment 120 shown in FIG. 12 may be set according to an actual requirement.

The example in FIG. 11 and FIG. 12 are intended to help a person skilled in the art better understand the embodiments of the present disclosure, but not to limit the scope of the embodiments of the present disclosure. Apparently, a person skilled in the art may make various equivalent modifications or variations according to the provided example, and such modifications or variations shall also fall within the scope of the embodiments of the present disclosure.

Optionally, a switch 152 is disposed at a place at which the air intake vent of the heat dissipation compartment 130 is connected to the air supply channel 150, and a switch 153 is disposed at a place at which the air exhaust vent of the heat dissipation compartment is connected to the air exhaust channel 151. When the heat dissipation system 1100 is running, the switch 152 and the switch 153 are turned on. When the heat dissipation system 1100 is not running, the switch 152 and the switch 153 may be turned off.

The operating compartment 120 and the heat dissipation compartment 130 are independent of each other. Therefore, during maintenance of a server 121, the heat dissipation system 1100 may still properly run, and the switch 152 and the switch 153 do not need to be turned off.

Figure 13:
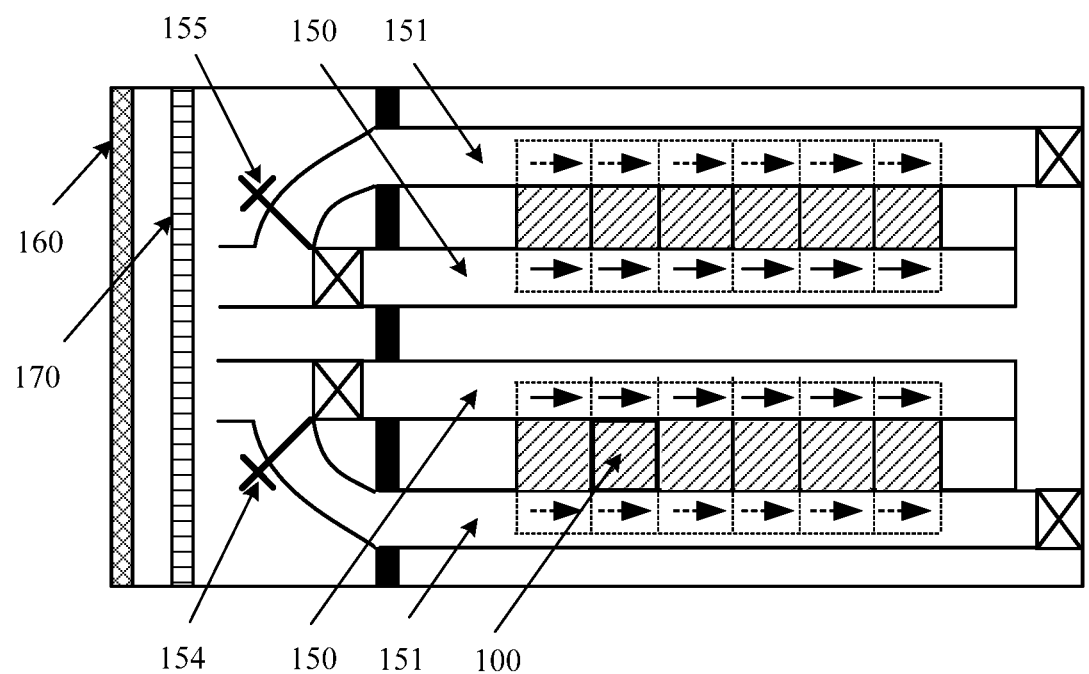
FIG. 13 is a schematic plan view of a heat dissipation system according to another embodiment of the present disclosure.

Optionally, as shown in FIG. 13, the heat dissipation system 1100 may further include: a filter apparatus 160, disposed between the air exhaust vent of the air supply channel 150 and the air intake vent of the heat dissipation compartment 130, and configured to filter the natural air.

Optionally, the heat dissipation system 1100 may further include a cooling apparatus 170, where the cooling apparatus 170 is disposed between the air exhaust vent of the air supply channel 150 and the air intake vent of the heat dissipation compartment 130, and is configured to start when a temperature of the natural air is higher than a first preset value, so as to reduce the temperature of the natural air. For example, the cooling apparatus 170 may be a spray-type cooling apparatus. For example, when the temperature of the natural air is higher than 35° C., spray cooling is started, to reduce the temperature of the natural air.

Optionally, the heat dissipation system 1100 may further include: a guiding apparatus, disposed between the air supply channel 150 and the air exhaust channel 151, and configured to: when the temperature of the natural air is lower than a second preset value, reflow a part of hot air expelled through the air exhaust channel 151 to the air supply channel 150, so as to increase the temperature of the natural air. For example, when the temperature of the natural air is lower than −25° C., the guiding apparatus may reflow at least a part of hot air to the air supply channel, so as to increase the temperature of the natural air. For example, the guiding apparatus may be a reflow pipeline; one end of the reflow pipeline is connected to the air supply channel 150, and the other end of the reflow pipeline is connected to the air exhaust channel 151.

Optionally, the air exhaust channel 151 is connected to the air supply channel 150. Switches are disposed at places at which the air exhaust channel 151 is connected to the air supply channel 150, such as a switch 154 and a switch 155 shown in FIG. 13. The switch 154 and the switch 155 are configured to: keep a close state in a normal operation state, where cool air absorbed from the outside of the data center through the air supply channel 150 enters the heat dissipation compartment 130, hot air expelled from the heat dissipation compartment 130 is expelled from the data center through the air exhaust channel 151, and the cool air in the air supply channel 150 and the hot air in the air exhaust channel 151 are not mutually blown; and keep an open state when the temperature of the natural air absorbed from the outside of the data center through the air supply channel 150 is lower than the second preset value, so that at least a part of hot air in the air exhaust channel 151 is reflowed to the air supply channel 150 to improve the temperature of the natural air. When the temperature of the natural air absorbed from the outside of the data center through the air supply channel 150 meets a preset condition, the switch 154 and the switch 155 are in the close state.

According to the heat dissipation system in this embodiment of the present disclosure, natural air is supplied through an air supply channel to dissipate heat in a heat dissipation compartment of a cabinet. Therefore, power consumption of an air conditioner in a data center can be reduced, and power usage effectiveness of the data center can be improved. In addition, because the power consumption of the air conditioner is reduced, infrastructure costs of the data center can be reduced.

In addition, natural air supplied through the air supply channel is processed by disposing a filter apparatus, a cooling apparatus, and a guiding apparatus. Therefore, heat dissipation efficiency can be improved, and reliability of the heat dissipation system can be improved.

In the present disclosure, when a specific component is located between a first component and a second component, an intermediate component may exist between the specific component and the first component or the second component or an intermediate component may not exist; and when a specific component is connected to another component, the specific component may be directly connected to the another component without using an intermediate component, or may be indirectly connected to the another component by using an intermediate component.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A cabinet, comprising:
   an operating compartment, disposed on a first side of a heat dissipation substrate, wherein the operating compartment is configured to accommodate a server with a positioning and locking mechanism, wherein the positioning and locking mechanism is configured to adjust a distance between the server and the heat dissipation substrate; and
   a heat dissipation compartment, disposed on a second side of the heat dissipation substrate, wherein the second side of the heat dissipation substrate is opposite from the first side of the heat dissipation substrate;
   wherein the heat dissipation compartment and the operating compartment share a third compartment wall formed using the heat dissipation substrate;
   wherein the operating compartment is separated from the heat dissipation compartment by the heat dissipation substrate;
   wherein the heat dissipation compartment accommodates multiple heat dissipation fins, and the multiple heat dissipation fins are thermally-coupled to the heat dissipation substrate;
   wherein the heat dissipation substrate is configured to conduct heat generated by the server in the operating compartment to the multiple heat dissipation fins;
   wherein a first air intake vent is disposed in a first compartment wall of the heat dissipation compartment, and a first air exhaust vent is disposed in a second compartment wall of the heat dissipation compartment, the first air intake vent and the first air exhaust vent being disposed in a manner that natural air enters the heat dissipation compartment through the first air intake vent and passes through the multiple heat dissipation fins, and heat of the multiple heat dissipation fins is expelled through the first air exhaust vent; and
   wherein the heat dissipation compartment comprises the first compartment wall, the second compartment wall and the third compartment wall.

2. The cabinet according to claim 1, wherein when the operating compartment accommodates the server, a thermally conductive wall exists on a side on which a chassis of the server is connected to the heat dissipation substrate, a thermally conductive apparatus is disposed in the server, one end of the thermally conductive apparatus is thermally-coupled to the thermally conductive wall, and an opposite end of the thermally conductive apparatus is thermally-coupled to a device of the server, causing heat generated by the device of the server to be conducted to the heat dissipation substrate using the thermally conductive apparatus and the thermally conductive wall.

3. The cabinet according to claim 2, wherein the positioning and locking mechanism of the server comprises:
   a first guiding plate, disposed on a third side of the thermally conductive wall, and located outside the chassis of the server;
   a first cam mechanism, disposed between the first guiding plate and the thermally conductive wall;
   a second guiding plate, disposed on a fourth side of a second side wall that is opposite to the thermally conductive wall, and located outside the chassis of the server;
   a second cam mechanism, disposed between the second guiding plate and the second side wall; and
   a first ejector handle and a second ejector handle, respectively connected to the first cam mechanism and the second cam mechanism;
   wherein the first guiding plate, the first cam mechanism, and the first ejector handle are configured to establish, when the first ejector handle is set to a first state, a first distance between the first guiding plate and the thermally conductive wall;
   wherein the first guiding plate, the first cam mechanism, and the first ejector handle are further configured to establish, when the first ejector handle is set to a second state, a second distance between the first guiding plate and the thermally conductive wall, wherein a difference between the first distance and the second distance is a preset value; form
   wherein the second guiding plate, the second cam mechanism, and the second ejector handle are configured to establish, when the second ejector handle is set to the first state, a third distance between the second guiding plate and the second side wall; and
   wherein the second guiding plate, the second cam mechanism, and the second ejector handle are further configured to establish, when the second ejector handle is set to the second state, a fourth distance between the second guiding plate and the second side wall, wherein the difference between the third distance and the fourth distance is the preset value.

4. The cabinet according to claim 3, wherein no thermally conductive medium is disposed in a first area on a surface of the first side of the heat dissipation substrate, and a groove is disposed in the first area to accommodate the first guiding plate, and the first area is an area in which the first guiding plate is in contact with the heat dissipation substrate when the server is placed into the operating compartment.

5. The cabinet according to claim 1, further comprising a thermally conductive medium, disposed on a surface of the first side of the heat dissipation substrate.

6. The cabinet according to claim 1, wherein a fan is disposed in the heat dissipation compartment.

7. The cabinet according to claim 1, wherein the heat dissipation compartment further accommodates a heat pipe, wherein one end of the heat pipe is thermally-coupled to the heat dissipation substrate, and an opposite end of the heat pipe is connected to the multiple heat dissipation fins; and
wherein the heat pipe is configured to conduct heat of the heat dissipation substrate to the multiple heat dissipation fins.

8. The cabinet according to claim 1, wherein a third air vent is disposed in a fourth compartment wall in the operating compartment different from the third compartment wall, a fan is disposed in the operating compartment, and the fan in the operating compartment and the third air vent of the operating compartment are configured to expel heat in the operating compartment from the operating compartment through the third air vent.

9. A heat dissipation system, comprising:
the cabinet according to claim 1;
an air supply channel, wherein the inside of the air supply channel is separated from inside of a data center, a second air intake vent of the air supply channel is disposed outside the data center, and a second air exhaust vent of the air supply channel is separately connected to the first air intake vent of the heat dissipation compartment of the cabinet, causing natural air to enter the heat dissipation compartment of the cabinet from the air supply channel; and
an air exhaust channel, wherein the inside of the air exhaust channel is separated from the inside of the data center, a third air intake vent of the air exhaust channel is separately connected to the first air exhaust vent of the heat dissipation compartment of the cabinet, and a third air exhaust vent of the air exhaust channel is disposed outside the data center, causing, after passing through at least one heat dissipation fin of the multiple heat dissipation fins in the heat dissipation compartment, the natural air to be expelled from the heat dissipation compartment through the air exhaust channel.

10. The heat dissipation system according to claim 9, further comprising a filter apparatus, disposed between the second air exhaust vent of the air supply channel and the first air intake vent of the heat dissipation compartment, and configured to filter the natural air.

11. The heat dissipation system according to claim 9, further comprising a cooling apparatus, disposed between the second air exhaust vent of the air supply channel and the first air intake vent of the heat dissipation compartment, the cooling apparatus being configured to start when a temperature of the natural air exceeds a first preset value, causing a reduction the temperature of the natural air.

* * * * *